United States Patent [19]

Inaba et al.

[11] Patent Number: 4,797,890
[45] Date of Patent: Jan. 10, 1989

[54] SEMICONDUCTOR LIGHT EMITTING DEVICE WITH VERTICAL LIGHT EMISSION

[75] Inventors: Fumio Inaba, 1-13-1, Yagiyama-minami; Hiromasa Ito, 390-82, Aza-aoba, Aramaki, both of Sendai-shi, Miyagi-ken; Noriaki Onodera, Sendai; Akira Mizuyoshi, Amagasaki, all of Japan

[73] Assignees: Mitsubishi Cable Industries, Ltd.; Ricoh Company, Ltd.; Ricoh Research Institute of General Electronics; Fumio Inaba; Hiromasa Ito

[21] Appl. No.: 946,324

[22] Filed: Dec. 24, 1986

[30] Foreign Application Priority Data

Dec. 24, 1985 [JP] Japan .............................. 60-291536
Jan. 10, 1986 [JP] Japan .............................. 61-4032
Jan. 11, 1986 [JP] Japan .............................. 61-2891

[51] Int. Cl.⁴ .................... H01S 3/19; H01L 33/00; H01J 1/62
[52] U.S. Cl. .......................... 372/46; 372/45; 372/48; 372/49; 372/50; 357/16; 357/17; 313/498; 313/499
[58] Field of Search .................. 357/17, 16, 19, 55; 372/46, 45, 48, 49, 50; 313/498, 499, 500, 510

[56] References Cited

U.S. PATENT DOCUMENTS

| | | | |
|---|---|---|---|
| 4,342,944 | 8/1982 | Springthorpe | 357/17 |
| 4,577,209 | 3/1986 | Forrest et al. | 357/16 |
| 4,660,207 | 4/1987 | Svilans | 372/46 |

FOREIGN PATENT DOCUMENTS

| | | | |
|---|---|---|---|
| 0027072 | 4/1981 | European Pat. Off. | 357/17 |
| 0177617 | 4/1986 | European Pat. Off. | |
| 0044779 | 3/1983 | Japan | 357/17 |
| 1088790 | 10/1967 | United Kingdom | |

Primary Examiner—William L. Sikes
Assistant Examiner—Georgia Y. Epps
Attorney, Agent, or Firm—Cooper & Dunham

[57] ABSTRACT

A semiconductor light emitting device, such as a light emitting diode or laser, includes a substrate which is provided with a hole and a pn junction extending adjacent to and in parallel with the side wall of the hole. Thus, the side wall of the hole extends in a direction perpendicular to a main surface of the substrate. A pair of electrodes is provided such that current flows across the pn junction so that light emitted in a vertical direction which is perpendicular to the main surface of the substrate. The hole may be either a through hole or a bore hole. With the additional provision of a pair of resonators, there is provided a semiconductor laser.

24 Claims, 9 Drawing Sheets

SEMICONDUCTOR LIGHT EMITTING DEVICE WITH VERTICAL LIGHT EMISSION

BACKGROUND OF THE INVENTION

1. Field of the Invention

This invention generally relates to a light emitting device, and, in particular, to a semiconductor light emitting device, such as a light emitting diode or semiconductor laser, for emitting light in a direction perpendicular to a main surface of a substrate. More specifically, the present invention relates to a semiconductor laser device capable of emitting a laser beam in a vertical direction with respect to a main surface of a substrate.

2. Description of the Prior Art

A semiconductor light emitting device, such as a light emitting diode or semiconductor laser, is well known in the art, and it generally includes a semiconductor substrate in which one or more PN junctions are provided to define an activation region for emitting light. A semiconductor light emitting device capable of emitting light in a vertical direction with respect to a main surface of a substrate is also known and this type of semiconductor light emitting diode is preferred because it can be easily coupled to a light transmitting element, such as an optical fiber, and it has various possible applications, such as a display device.

FIGS. 1 and 2 show typical prior art semiconductor light emitting devices capable of emitting light in a vertical direction. A light emitting device shown in FIG. 1 includes a semiconductor substrate 2 having an electrode 1 attached to its bottom. The substrate 2 includes a p-AlGaAs layer 21, a p-AlGaAs activation layer 3 and an n-AlGaAs layer 22 from bottom to top, and another electrode 5 circular in shape is provided on the layer 22. On the other hand, FIG. 2 shows a prior art light emitting device which includes a semiconductor substrate 2 having a bottom electrode attached to the bottom thereof. The substrate 2 includes an n-GaAs layer 24, an n-GaAsP graded layer 25 and an n-GaAsP layer 26 from bottom to top, and a circular top electrode 5 having a light emitting opening 51 is provided on layer 26. And, an activation layer 3 is formed inside of the n-GaAsP layer 26 at a location immediately below the light emitting opening 51.

As is obvious from FIGS. 1 and 2, even if it is of the vertical light emitting type, any prior art semiconductor light emitting device includes one or more PN junctions defined in a substrate to define an activation region, where the light-emitting phenomenon takes place, as extending in parallel with a main surface thereof, which is a surface having a larger area. And, the activation region typically has a thickness in the order of 2-3 microns. As a result, in order to attain a sufficiently large gain in the intensity of light emitted in a direction vertical to the main surface of the substrate, an extremely large injection current density is required. Since the activation layer 3 extends laterally or in parallel with the main surface and the light emitting function takes place across the entire activation layer 3, the light emitted in the direction perpendicular to the main surface of the substrate is lower and limited in light intensity.

SUMMARY OF THE INVENTION

In accordance with the principle of the present invention, there is provided a semiconductor light emitting device which comprises a semiconductor substrate having a main surface, and an activation region formed in the substrate extending in a direction substantially perpendicular to the main surface of the substrate. In this manner, the activation region defined by one or more PN junctions formed in the substrate extends with its longitudinal direction substantially perpendicular to the main surface of the substrate, so that there can be easily obtained an increased light intensity in the light emitting in the direction substantially vertical to the main surface of the substrate.

In the preferred embodiment, at least one hole in the form of bore is formed in the substrate with its open end located in the main surface. The hole is formed in the substrate with its centerline extending in a direction substantially perpendicular to the main surface of the substrate. And, the active region is defined by introducing impurities into the substrate through the main surface and the surface of the hole, so that the active region extending perpendicular or substantially perpendicular to the main surface of the substrate is formed. The gain of the emitted light in the vertical direction can be easily controlled by the depth of the hole.

It is therefore a primary object of the present invention to obviate the disadvantages of the prior art as described above and to provide an improved light emitting device.

Another object of the present invention is to provide an improved semiconductor light emitting device, such as a light emitting diode or semiconductor laser, which emits light in a vertical direction.

A further object of the present invention is to provide an improved semiconductor light emitting device which can be easily coupled to a light transmitting element, such as an optical fiber.

A still further object of the present invention is to provide an improved semiconductor light emitting device suitable for use as a display unit.

A still further object of the present invention is to provide an improved semiconductor light emitting device capable of emitting light high in output in a vertical direction, simple in structure and thus easy to manufacture.

Other objects, advantages and novel features of the present invention will become apparent from the following detailed description of the invention when considered in conjunction with the accompanying drawings.

DESCRIPTION OF THE PREFERRED EMBODIMENTS

Figure 1:
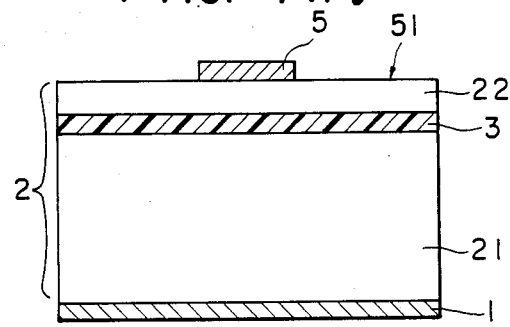
FIGS. 1 and 2 are schematic, cross sectional views showing two typical prior art semiconductor light emitting devices capable of emitting light in a vertical direction.
Figure 2:
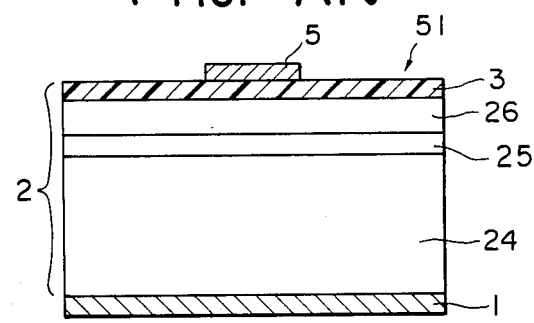
Figure 3:
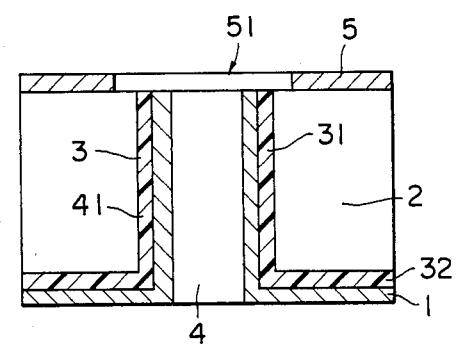
FIGS. 3 through 5 are schematic, cross sectional views showing several semiconductor light emitting devices constructed in accordance with the present invention.

Referring now to FIG. 3, there is schematically shown a semiconductor light emitting device constructed in accordance with one embodiment of the present invention. As shown, the present device includes a semiconductor substrate 2 which is generally rectangular or circular in shape in the illustrated example and which has a pair of top and bottom main surfaces which are relatively large in area. The substrate 2 is provided with a through hole 4 extending in a direction perpendicular to the pair of top and bottom main surfaces of the substrate 2. An active region 3 is defined in the substrate along a side wall 41 of the hole 4, and the active region 3 is typically defined by introducing an impurity material, such as Zn, into the substrate 2 through the side wall 41 to a predetermined depth. When introducing the impurity material into the substrate 2 through the side wall 41, it is also introduced into the substrate 2 through the bottom main surface, so that the active region 3 of the illustrated embodiment includes not only a vertical active region 31, but also a horizontal active region 32. It is to be noted that the horizontal active region 32 is not always necessary from the view point of the present invention, and, thus, the present light emitting device may also be structured without the horizontal active region 32, if desired. It should also be noted that, as well known in the art, the active region is a region in which recombination between holes and electrons take place to thereby emit light.

A bottom electrode 1 is formed on the bottom main surface of the substrate 2 and also on the side wall 41 continuously. On the other hand, a top electrode 5 in the form of a ring or having a circular opening 51 larger in diameter than the outer diameter of the vertical active region 31 is formed on the top main surface of the substrate 2. The opening 51 formed by the top electrode 5 defines a light emitting opening through which the light emitted from the vertical active region 31 is lead out to the exterior. The substrate 2 may be comprised of a material selected from a group consisting essentially of GaAS, AlGaAs, InP, InAsP and InAsSb, which are Group III–V compound semiconductor materials, from a group consisting essentially of ZnSe, ZnS, ZnO, CdSe and CdTe, which are Group II–VI compound semiconductor materials, or from a group consisting essential of PdTe, PdSnTe and PdSnSe, which are Group IV–VI compound semiconductor materials.

Figure 4:
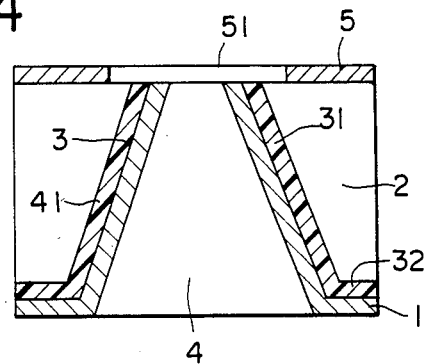

It is to be noted that although the term "vertical" is used to denote the active region defined adjacent to the side wall 41 of the through hole 4, the active region 31 should not be limited only to the case in which the active region 31 extends at right angles with respect to the top main surface. The vertical active region 31 may be inclined inwardly or outwardly with respect to the main top surface, which is the surface through which emitted light is lead out to the exterior, of the substrate 2. FIG. 4 shows a modified structure in which the through hole 4 defined in the substrate 2 has a truncated conical shape, so that the side wall 41 of the hole 4 and thus the vertical active region 31 formed along the side wall 41 is inclined with respect to the center line of the through hole 4. Other than the fact that the through hole 4 has a truncated conical shape and thus the active region 31 is inclined with respect to the top main surface of the substrate 2, the remaining structure remains the same as that shown in FIG. 3. With this structure, the light emitted is convergent in the direction of travel.

Figure 5:
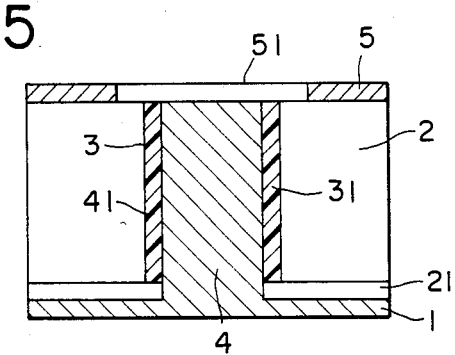

FIG. 5 shows a semiconductor light emitting device constructed in accordance with another embodiment of the present invention. Similarly with the structure shown in FIG. 3, the present device also includes a semiconductor substrate 2 which also has a pair of top and bottom main surfaces and a through hole 4 extending vertically or substantially vertically with respect to the top main surface. The substrate 2 is provided with a vertical active region 31 formed along the side wall 41 of the through hole 4 and no horizontal active region is provided in the substrate 2 of this embodiment. Instead, an electrically insulating layer 21 is formed on the bottom main surface of the substrate 2, for example, from $SiO_2$ or $SiN_4$. With the provision of this insulating layer 21, when a selected impurity material is diffused into the substrate 2 through the side wall 41 to form the lateral active region 31, the insulating layer 21 serves as a mask thereby preventing the impurity material from being diffused into the substrate 2 through the bottom main surface thereof. Thus, no lateral or horizontal active region is formed in the substrate 2 of this embodiment. In addition, a bottom electrode 1 is formed as extending on the insulating layer 21 and being plugged into the through hole 4. A top electrode 5 having a circular opening 51 is formed on the top main surface of the substrate 2. Thus, the opening 51 defines a light emitting opening through which the light emitted from the vertical active region 31 is lead out to the exterior. It should be noted that the column section of the bottom electrode 1 plugging the through hole 4 also serves as a heat sink for dissipating heat produced by the active region 31 thereby maintaining the active region 31 relatively at constant temperature.

As is obvious for one skilled in the art, the longer the longitudinal length of the vertical active region 31, the larger the gain of output light in the vertical direction, i.e., direction perpendicular to the main top surface of the substrate 2, where the light emitting opening 51 is provided. As a result, in order to provide a high power light emitting device, it is preferable to use the substrate 2 whose thickness is as large as possible. For example, the thickness of the substrate 2 is set at least at 10 microns, or preferably at least at 20 microns, more more preferably at least at 100 microns.

Figure 6:
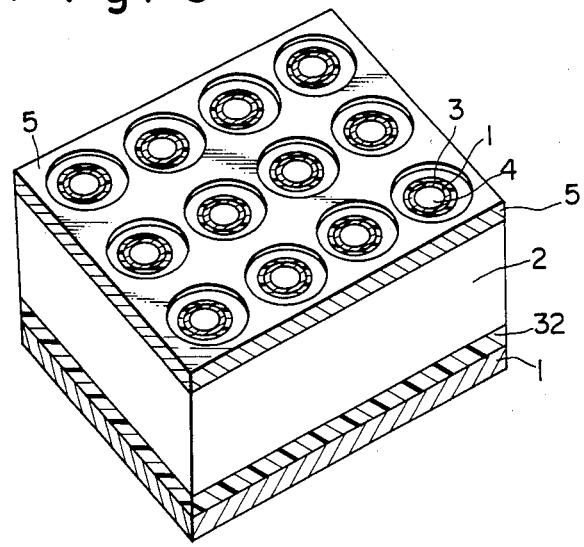
FIG. 6 is a schematic, perspective view showing a semiconductor light emitting array device constructed in accordance with a further embodiment of the present invention.

FIG. 6 shows an array type semiconductor light emitting device using one of the structures shown in FIGS. 3 and 4. This embodiment may be fabricated by providing a plurality of through holes 4 in a single substrate 2 in the form of a two dimensional array, for example, by etching, introducing a selected impurity material into the substrate 2 at least through the side wall of each of the plurality of through holes 4, and then forming a pair of top and bottom electrodes 5 and 1 on the top and bottom main surfaces of the substrate 2. As a modification, the top electrode 5 may be subdivided such that each subdivided section is unique to the corresponding through hole 4, in which case the plurality of vertical active regions 41 may be activated individually, so that such a modified structure may be used as a display unit. Besides, the structure shown in FIG. 5 may also be applied to form an array device as shown in FIG. 6.

As described above, the basic structure of the present invention requires the formation of a through hole extending vertically or inclined with respect to at least one main surface of the substrate. And, such a through hole can be easily formed at high precision by various techniques well known for one skilled in the art, for example, the reactive ion etching technique. Besides, the vertical active region 31 can also be easily formed, for example, by diffusion of a selected impurity material, such as Zn. Thus, the structure of the present invention can be fabricated with ease using the conventional semiconductor manufacturing techniques, so that the present device can be fabricated at low cost because it does not require expenditure of capital or facility cost.

It should also be noted that the characteristic between the emitted light intensity and the length of active region is linear for a light emitting diode having the length of active region in the order of a few microns. However, if the active region is relatively long, the light generated by induced emission increases spontaneous emission as it propagates along the active region, thereby providing an amplified spontaneous light emission. As described above, in accordance with the principle of the present invention, since there can be provided a relatively long vertical active region, for example, of 10 microns or more simply by using a substrate 2 having a desired thickness, so that a high gain of light output in the vertical direction can be obtained quite easily.

Figure 7:
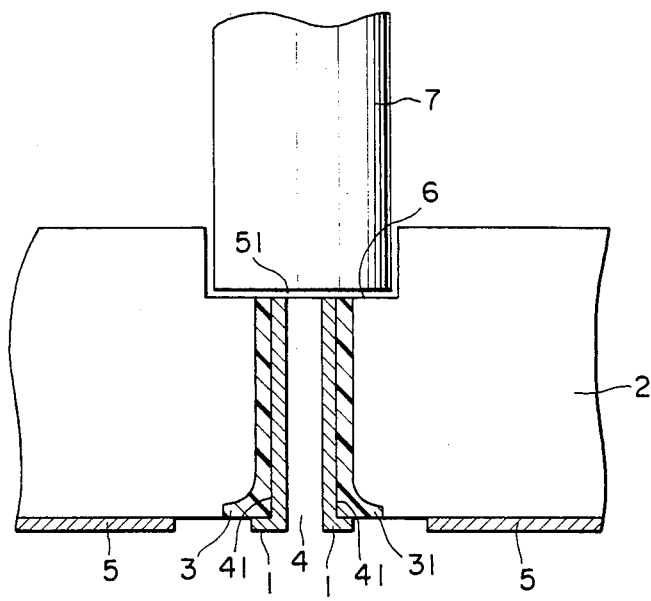
FIG. 7 is a schematic, cross sectional view showing a semiconductor light emitting device constructed in accordance with a still further embodiment of the present invention, wherein one end of an optical fiber is fitted into a receiving hole formed in one surface of a substrate.

Referring now to FIG. 7, there is schematically shown in cross section a semiconductor light emitting device constructed in accordance with a further embodiment of the present invention. As shown, the present device includes a plate-shaped substrate 2 which has a pair of opposite top and bottom main surfaces and which is provided with a through hole 4 extending through the substrate 2. A circular recess 6 is formed in the top main surface of the substrate 2 to a predetermined depth and the diameter of the circular recess 6 is sized to receive therein one end of an optical fiber 7. In the illustrated embodiment, the recess 6 has a flat surface which is generally in parallel with the top main surface of the substrate 2. The through hole 4 extends from the bottom surface of the recess 6 to the bottom surface of the substrate 2 and it is defined by a side wall 41. An active regions 31 is formed in the substrate along the side wall 41 by causing a selected impurity material, such as Zn, to be diffused into the substrate 2 through the side wall 41. Thus, light is emitted in the active region 31 and propagates along the longitudinal direction of the through hole 4 to be lead into the optical fiber 7.

A bottom electrode 5 having a circular opening is formed on the bottom surface of the substrate 2, and another electrode 1 is formed on the side wall 41 of the through hole 4 and on the bottom surface of the substrate 2 around the periphery of the bottom end of the through hole 4. The bottom end of the optical fiber 7 is preferably cemented into the recess 6. Thus, the top end of the active region 31 defines a light emitting opening, through which emitted light is introduced into the optical fiber 7. By suitably sizing the diameter of the receiving recess 6, the bottom end of the optical fiber 7 may be simply press-fitted into the recess 6 so as to have the bottom end of the optical fiber 7 fixedly attached to the light emitting opening 51, if desired. In the illustrated embodiment, the active region 31 extends perpendicular to or substantially perpendicular to the bottom surface of the recess 6; however, the active region 31 may also be so formed to be conically upwardly or downwardly, as desired. In the latter case, the active region 31 is inclined with respect to the bottom surface of the recess 6. The depth of the receiving recess 6 is preferably set in a range between approximately 500 microns and approximately 2 mm.

Figure 8:
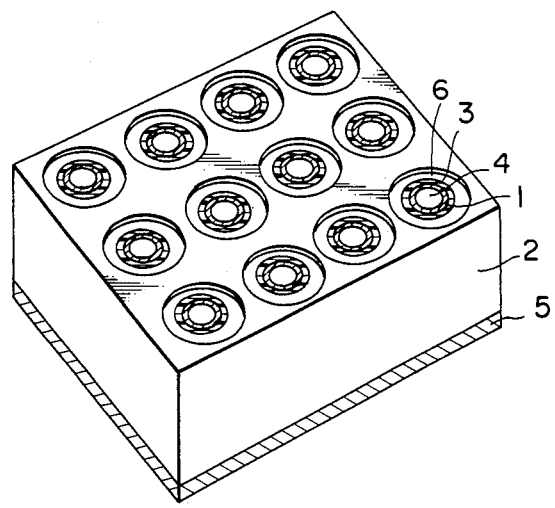
FIG. 8 is a schematic, cross sectional view showing a semiconductor light emitting array device constructed in accordance with a still further embodiment of the present invention using the structure shown in FIG. 7.

FIG. 8 shows in perspective view an array type light emitting device constructed in accordance a still further embodiment of the present invention using the structure shown in FIG. 7 as a unit element. That is, as shown in FIG. 8, the light emitting element shown in FIG. 7 is defined in the substrate 2 in the form of a two dimensional array. In this embodiment, each light emitting element has an individual electric 1 because it is mainly formed on the side wall 41 of each through hole 4. Thus, using the bottom electrode 5 as a common electrode, the plurality of light emitting elements defined in the same substrate 2 can be controlled individually in operation. Such a structure is particularly advantageous when applying the present invention to a display apparatus.

Figure 9:
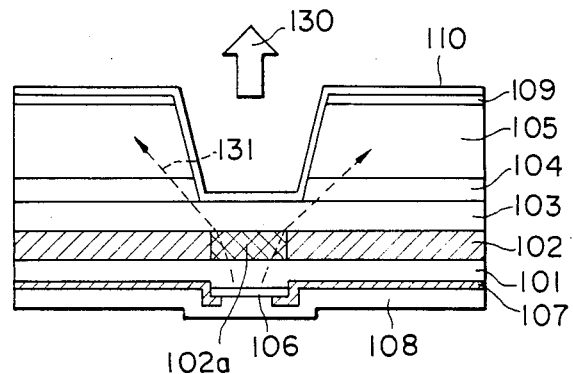
FIG. 9 is a schematic, cross sectional view showing another typical prior art semiconductor light emitting device capable of emitting light in a vertical direction.

Now, another aspect of the present invention will be described. First, referring to FIG. 9, another prior art semiconductor laser device which emits a laser beam in a vertical direction will be described. The laser device shown in FIG. 9 includes a first semiconductor layer 101 having a first conductivity type, a second semiconductor layer 102 having a narrower forbidden band gap than that of the first layer 101 and serving as an active layer and a third semiconductor layer 103 formed on the second semiconductor layer 102 and having a second conductivity type, which is opposite in polarity to the first conductivity type, and a broader forbidden band gap than that of the second layer 102. In addition, on the third semiconductor layer 103 is formed fourth and fifth semiconductor layers 104 and 105 one on top of another in the order mentioned. On the other hand, at a selected portion of a bottom surface of the first semiconductor layer 101 is formed an electrode semiconductor layer 106 of the first conductivity type and a silicon dioxide layer 107 is formed on the remaining bottom surface of the first semiconductor layer 101. Moreover, an electrode metal layer 108 is formed on these layers 106 and 107 and this metal layer 108 also serves as a reflecting mirror.

As shown, a recess is formed as extending through the fourth and fifth semiconductor layers 104 and 105, and the bottom of this recess is coplanar with the interface between the layers 103 and 104. On the top surface of the fifth semiconductor layer 105 is formed an electrode metal layer 109 of the second conductivity type, and a reflecting electrode layer 110 is formed on the electrode metal layer 109 and also on the side and bottom walls of the recess.

With the above-described structure, when current is supplied to flow between the top and bottom electrodes 108 and 109, the current flows in the direction indicated by the arrows 131, so that the current 131 mainly flows through an active region or light emitting portion 102a of the second semiconductor layer 102, thereby causing light to be emitted, whereby the light thus emitted is confined between the electrode metal layers 108 and 109, which also serve as reflecting mirrors, so that laser oscillation takes place and thus a laser beam 130 is emitted to the exterior in a vertical direction perpendicular to the plane or main surface of the device.

In such a prior art vertical emitting type semiconductor laser device, since carriers are confined in the active region, the thickness of the semiconductor layer 102, which defines the active region, must be set equal to or less than the diffusion length of carriers, which is approximately 2–3 microns. As a result, there is a limit in the gain of a laser beam emitted in the vertical dimension because the thickness of the active region cannot be made larger. It is true that the laser output can be increased by increasing the level of current, but this is disadvantageous because it causes other problems. In addition, in the structure shown in FIG. 9, the top electrode 109 at the beam output side is annular in shape, so that the injected current tends to flow sideways as indicated by the arrows 131. Thus, in this structure, it is difficult to produce current concentration. In addition, since the light emitting portion 102 extends laterally, the current injection efficiency into the active region 102a tends to be reduced. For these reasons, when operating such a prior art device as a laser, it is extremely difficult to lower the threshold current and also to increase its output power.

In accordance with this aspect of the present invention, there is provided a semiconductor light emitting device which comprises a substrate having one surface on which a semiconductor layer is formed, said semiconductor layer being provided with a recess extending from an outer surface of the semiconductor layer toward the substrate and an PN junction being formed in the semiconductor layer extending along the side wall of the recess. With this structure, current is caused to flow across the PN junction, thereby causing recombination of electrons and holes in the vicinity of the PN junction, so that light is emitted in a direction perpendicular or substantially perpendicular to the surface of the substrate or device. As described with respect to the previous embodiments, such a PN junction is preferably defined by causing a selected impurity material to be thermally diffused into the semiconductor layer from the outside surface.

Figure 10:
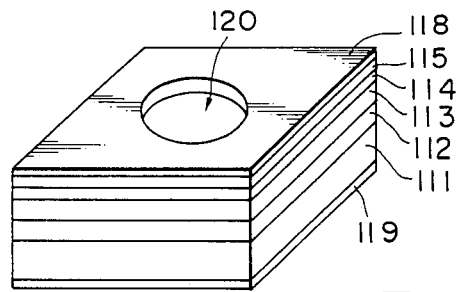
FIG. 10 is a schematic, perspective view showing a semiconductor light emitting device for emitting light in a vertical direction constructed in accordance with a still further embodiment of the present invention.
Figure 11:
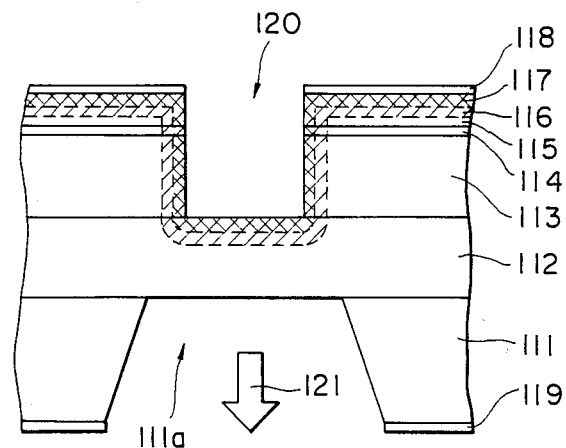
FIG. 11 is a schematic, cross sectional view of the device shown in FIG. 10.

Now, referring to FIG. 10, there is shown in perspective a semiconductor light emitting device constructed in accordance with one embodiment of this aspect of the present invention. And, FIG. 11 is a cross sectional view of the device shown in FIG. 10. As shown, the device includes an n-GaAs substrate 111, an n-AlGaAs layer 112, an n-GaAs layer 113, a p-AlGaAs layer 114 and an n-GaAs layer 115 overlying on top of another in the order mentioned. It is to be noted that the structure including all of these layers 111 through 115 is also referred to as a substrate. And, importantly, a recess 120 circular in shape in the illustrated embodiment is provided extending vertically through the layers 113, 114 and 115. Thus, the recess 120 extends generally vertically with respect to the top surface of the substrate 111 and the bottom surface of the recess 120 is coplanar with the interface between the layers 112 and 113. In the present embodiment, the recess 120 is cylindrical in shape; however, it may have any other shape, such as a conical shape, and the recess 120 also may have any other desired cross sectional shape than a circular shape as shown.

A selected impurity material, preferably Zn, is diffused into the present structure through the side and bottom walls of the recess 120 and the top surface of the layer 115, so that a p type diffusion region 116 and a p+ diffusion region 117 are defined. A p type electrode layer 118 is formed on the n-GaAs layer 115; on the other hand, an n type electrode layer 119 is formed on the bottom surface of the substrate 111, which is formed with a counter recess 111a in alignment with the recess 120 and reaching to the interface between the n-AlGaAs semiconductor layer 112 and the substrate 111. As will be described later in detail, in the present embodiment, light emitted is taken out in the direction indicated by the arrow 121.

It is to be noted that the PN junctions formed in the n-GaAs layer 115 as extending in parallel with the top surface of the substrate 111 are separated away from the p-AlGaAs layer 114. Thus, a pnpn structure is defined by the p type diffusion region 116, n-GaAs layer 115, p-AlGaAs layer 114 and n-GaAs layer 113. For this reason, the pnpn structure serves as a current flow blocking structure for the current flowing between the top and bottom electrode layers 118 and 119. As a result, the current flowing between the top and bottom electrode layers 118 and 119 is forced to flow preferentially along the side wall of the recess 120 and thus along the pn junction extending perpendicular to the top surface of the substrate 111. Accordingly, at and in the vicinity of the pn junction extending vertically along the side wall of the recess 120, recombination of electrons and holes takes place to emit light which is mainly guided to the exterior through the bottom recess 111a defined as a light outlet. Therefore, the vertical pn junction extending along the side wall of the recess 120, in effect, defines an active region for emitting light.

As described above, in accordance with the structure of the present embodiment, since the pnpn structure serves as a current blocking structure, the current flowing between the top and bottom electrodes mainly passes across the pn junction extending in parallel with the side wall of the recess 120, the current injection efficiency is significantly enhanced. Furthermore, with this structure, a heat sink (not shown) may be mounted on the top electrode layer 118 so that the heat sink may be placed close to the active region, thereby allowing to enhance the heat dissipating characteristic and to obtain a high light output. In addition, in accordance with this structure, the pn junction defining the active region can be set as long as possible in the direction of light emission, thereby permitting to enhance the directionality by narrowing the angle of divergence of emitted light. Moreover, as will be described more in detail later, by providing a pair of reflecting mirror elements so as to sandwich the active region therebetween, there can be easily defined a vertical light emitting type laser having an increased gain. In the structure shown in FIG. 11, the recess 120 has a bottom wall defined by the surface of the layer 112; however, as an alternative structure, the bottom wall of the recess 120 may be defined within the layer 113, if desired.

Figure 12A:
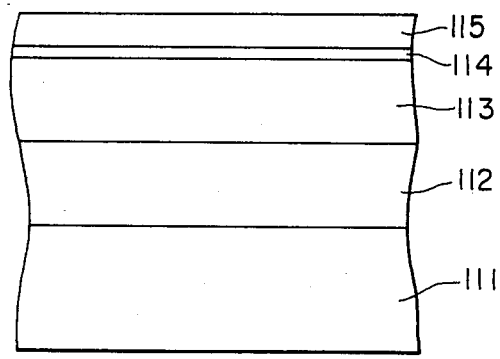
FIGS. 12a through 12c are schematic, cross sectional views showing steps in a process for manufacturing the device shown in FIGS. 10 and 11.
Figure 12B:
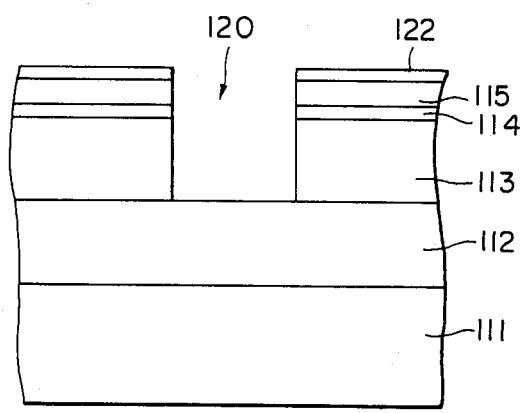

Now, with reference to FIGS. 12a through 12c, a method for manufacturing a semiconductor light emitting device having the structure shown in FIGS. 10 and 11 will be described. As shown in FIG. 12a, on an n-GaAs substrate or base layer 111 is formed an n-$Al_xGa_{1-x}As$ layer 112 (where, x is a mole fraction of Al and in a range between 0.2 and 0.45) to the thickness between 2 and 100 microns, an n-GaAs layer 113 to the thickness between 2 and 100 microns, a p-$Al_xGa_{1-x}As$ layer 114 (where, x is in a range between 0 and 0.4) to the thickness between 0.5 and 3 microns and an n-GaAs layer 115 to the thickness between 3 and 10 microns in the order mentioned from bottom to top. Then, as shown in FIG. 12b, after forming an electrically insulating layer 122 on the layer 115, an opening is formed in the insulating layer by photolithography. The insulating layer 122 is preferably comprised of a material, such as silicon oxide, silicon nitride, or resist. Using this insulating layer 122 with a hole as mask, a recess 120 is formed by dry etching until its bottom reaches the n-AlGaAs layer 112. This recess 120 may have any desired cross sectional shape, such as a circle, a rectangle or any other polygonal shape. As the dry etching technique, use is preferably made of reactive ion etching using a mixture gas containing chlorine gas and Ar gas.

Figure 12C:
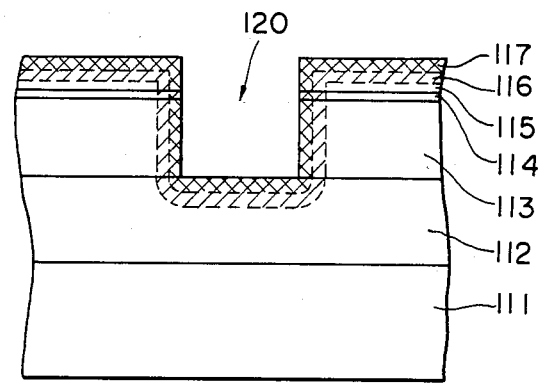

Then, as shown in FIG. 12c, after removing the mask 122, thermal diffusion is carried out using Zn as an impurity dopant, thereby forming a p type diffusion region 116 and a p+ diffusion region 117 along the side and bottom walls of the recess 120 and the top surface of the n-GaAs layer 115. In this case, preferably use is made of a two-step diffusion method. Furthermore, this diffusion step should be so controlled that the diffusion front defined by the diffusion of the impurity dopant introduced through the top surface of the n-GaAs layer 115 does not reach the underlying p-AlGaAs layer 114. Thereafter, a pair of top and bottom electrode layers is formed on the top and bottom surfaces and then a bottom recess 111a is formed in the substrate 111 by etching, thereby completing the structure shown in FIG. 10 and 11. The etching to form the bottom recess 111a may be preferably carried out by wet etching using an etchant containing ammonia and a solution of hydrogen peroxide. Such an etchant attacks GaAs but not AlGaAs, so that the etching automatically stops as soon as the n-AlGaAs layer 112 is exposed.

Figure 13:
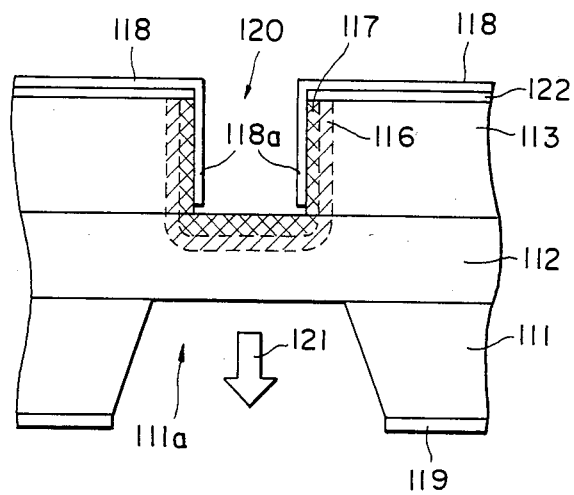
FIGS. 13 through 16 are schematic, cross sectional views showing several modified structures.

FIG. 13 shows a semiconductor light emitting device constructed in accordance with another embodiment of the present invention. Since this device has basically the same structure as that of the previous embodiment shown in FIGS. 10 and 11, like numerals indicate like elements and the description of the same elements will not be repeated. In the present embodiment, instead of the pnpn structure, an electrically insulating layer 122 is formed on the n-GaAs layer 113 and this insulating layer 122 serves as a current blocking structure. In addition, in the present structure, the Zn-diffused regions 116 and 117 are formed only along the side and bottom walls of the recess 120. And, a p type metal electrode layer 118 is formed not only on the insulating layer 122, but also on the inner side wall of the recess 120. That portion of the p type metal electrode layer 118 which is located within the recess 120 is indicated by 118a. Thus, also in the present embodiment, the current flowing between the top and bottom electrodes 118 and 119 is forced to flow preferentially across the pn junction extending vertically with respect to the top surface of the substrate 111, so that the current injection efficiency to the active region is significantly increased.

With this structure, the insulating layer mask 122 used as an etching mask when forming the recess 120 by dry etching is also used as a diffusion mask when carrying out diffusion of Zn, and, furthermore, the insulating layer 122 also serves as an electrical insulation between the electrode 118 and the n-GaAs layer 113. As a result, the manufacturing process is extremely simplified. Similarly with the previously described embodiment, this embodiment also allows to obtain a high light output power and to prevent the emitted light beam from becoming divergent.

Figure 14:
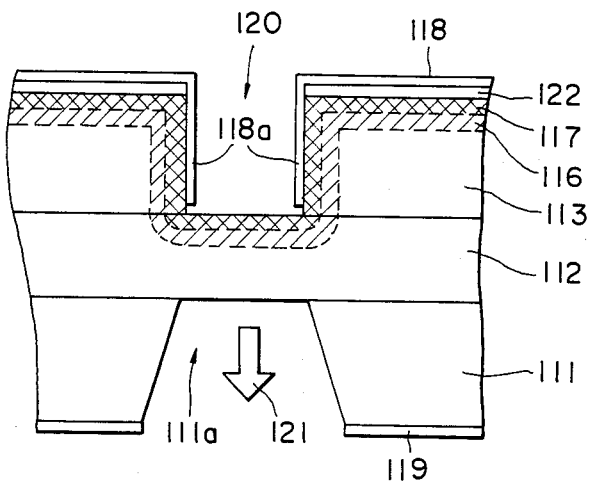

FIG. 14 shows another embodiment of the present invention, which is a modification of the structure shown in FIG. 13. Thus, the present embodiment is structurally similar to the embodiment shown in FIG. 13 in many respects; however, in the present embodiment, the diffusion regions 116 and 117 are formed not only along the side and bottom walls of the recess 120, but also along the top surface of the n-GaAs layer 113. In the present embodiment, the insulating layer 122 is not used as a diffusion mask when carrying out the Zn diffusion step, and it is formed after the Zn diffusion step.

Figure 15:
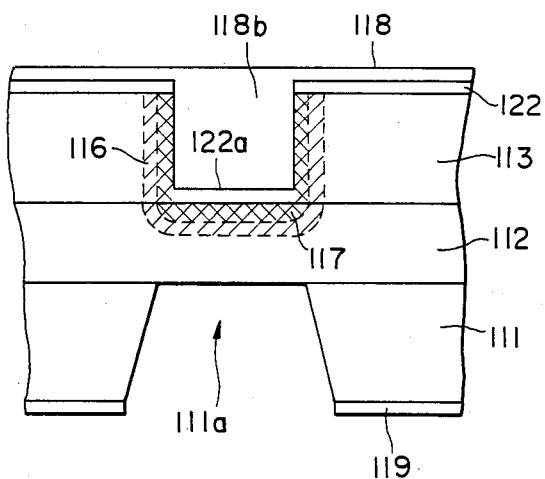

FIG. 15 shows a further embodiment of the present invention, which is similar in structure to the embodiment shown in FIG. 13 in many respects. In this embodiment, however, the recess 120 is plugged with the same material as that of the electrode layer 118, thereby defining a plugging portion 118b serving as part of a heat sink. With this structure, the heat sink 118 can be located very close to the active region extending perpendicular or substantially perpendicular to the surface of the substrate 111 so that the heat dissipating characteristic is significantly improved. In the present embodiment, an insulating film 122a is formed on the bottom wall of the recess 120, so that the electrode 118 and 118b is not in electrical contact with the layer 112 directly.

Figure 16:
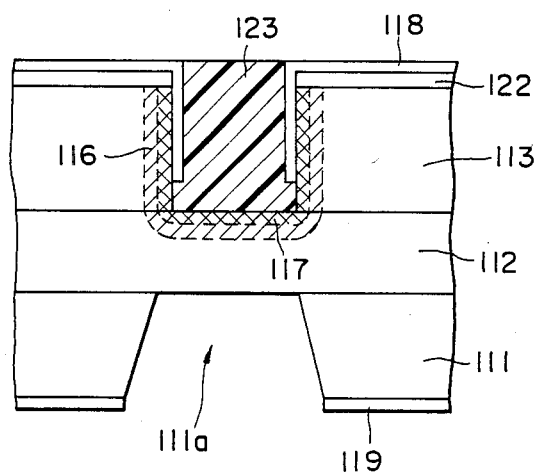

FIG. 16 shows a still further embodiment of the present invention, which is also very similar in structure to the device shown in FIG. 13 excepting the fact that the recess 120 is filled with a heat conductive resin material 123 so as to provide an enhanced heat dissipating characteristic. It is to be noted that the resin 123 may be replaced by polisilicon, is desired.

Figure 17:
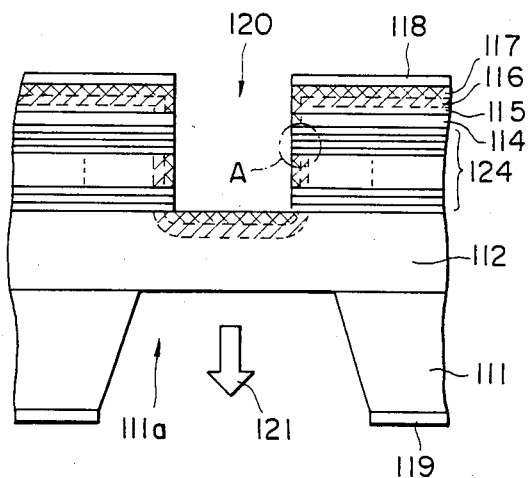
FIG. 17 is a schematic, cross sectional view showing a semiconductor laser for emitting light in a vertical direction constructed in accordance with one embodiment of the present invention.
Figure 18:
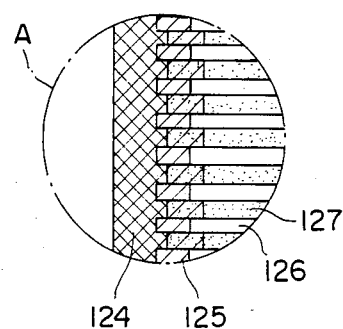
FIG. 18 is a fragmentary, cross sectional view showing on an enlarged scale that portion of the structure shown in FIG. 17 which is encircled by A.

FIGS. 17 through 20 show embodiments when the present invention has been applied to a laser. FIG. 17 shows a vertical light emitting type semiconductor laser constructed in accordance with one embodiment of the present invention and FIG. 18 shows the detailed structure of that portion which is surrounded by a circle A. In the present embodiment, on the N-AlGaAs layer 112 is formed a laminate layer 124, which, as shown in FIG. 18, is formed by overlying an n-GaAs layer 126 and an AlGaAs layer 127 one on top of another alternatively over a predetermined number of times. The thickness of each of the layers 126 and 127 is set at ¼ of an equivalent value of wavelength within the GaAs or AlGaAs layer 126 or 127 converted from the wavelength of emitted light. As a result, there is provided a so-called Distributed Feedback (DFB) structure. With the provision of such a DFB structure, there is provided optical resonators for the light travelling in the direction perpendicular to the surface of the substrate 111. In particular, in the present embodiment, a p+ type diffusion region 124, which is formed by Zn diffusion together with a p type diffusion region 125, forms a p+ AlGaAs layer having an average composition between those of the GaAs and AlGaAs layers 126 and 127. And, the forbidden band gap of this p+ AlGaAs layer is larger than that of the GaAs layer 126, but the refractive index of this p+ AlGaAs layer is smaller than that of the GaAs layer 126, so that there is obtained a structure to confine current and emitted light within the active region. For this reason, in accordance with the present embodiment, a high power output can be obtained and the level of threshold current can be set lower.

Figure 19:
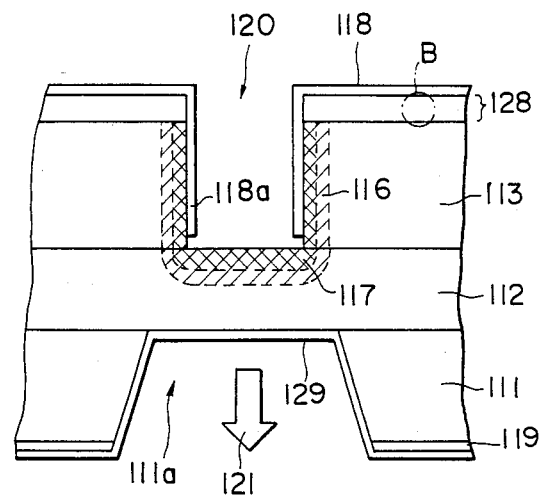
FIG. 19 is a schematic, cross sectional view showing a semiconductor laser for emitting light in a vertical direction constructed in accordance with another embodiment of the present invention.
Figure 20:
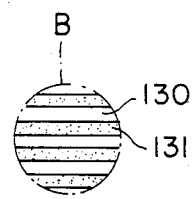
FIG. 20 is a fragmentary, cross sectional view showing on an enlarged scale that portion of the structure shown in FIG. 19 which is encircled by B.

FIG. 19 shows a vertical emitting type semiconductor laser device constructed in accordance with another embodiment of the present invention, and FIG. 20 shows that portion of the structure shown in FIG. 19 which is surrounded by a circle B. In the present embodiment, a multi-layer reflecting film 128 is formed on the top surface of the n-GaAs layer 113 and the diffusion regions 116 and 117 are provided only along the side and bottom walls of the recess 120. As shown in FIG. 20, the multi-layer reflecting film 128 is formed by overlying a first dielectric layer 130 and a second dielectric layer 131 one on top of another alternately over a predetermined number of times, and the thickness of each of the dielectric layers 130 and 131 is set at ¼ of an equivalent value of wavelength within the respective dielectric layers converted from the wavelength of emitted light. In addition, a bottom electrode layer 119 is formed on the bottom surface of the substrate 111 and a metal reflecting film 129 is formed on the entire bottom surface of the device including the entire surface of the light outlet recess 111a.

With this structure, the multi-layer reflecting film 128 and the metal reflecting film 129 defines a pair of optical resonators which sandwich the pn junction extending in parallel with the side wall of the recess 120, which defines an active region and thus generates light. Thus, the light generated in this active region propagates in a direction in parallel with the side wall of the recess 120 is reflected back and forth between these reflectors 128 and 129. In addition, the top electrode 118 includes a portion 118a which extends on the vertical side wall of the recess 120, so that the current flowing between the top and bottom electrode 118 and 119 is guided to flow across the vertical pn junction extending along the side wall of the recess 120 preferentially. Accordingly, in accordance with the present invention, there may be provided a semiconductor laser device with light emission in vertical direction, having a high light output power and a reduced threshold current level. As an example, the first dielectric layer 130 may be formed from TiO$_2$ and the second dielectric layer 131 may be formed from SiO$_2$. And, the metal reflecting film 129 may be preferably formed from Au.

Figure 21:
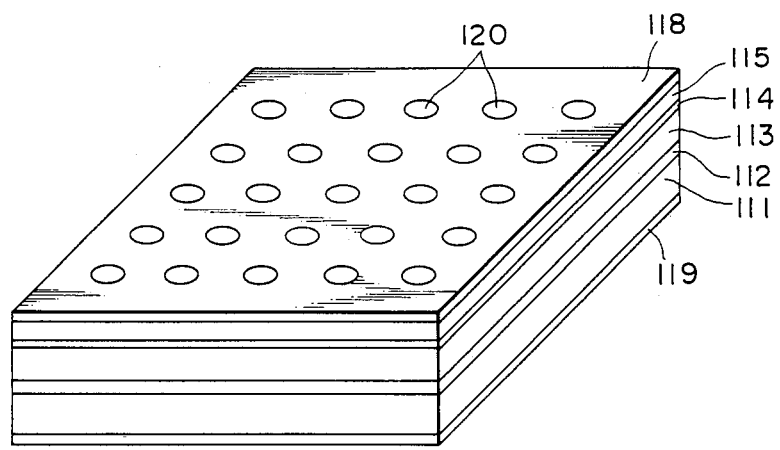
FIG. 21 is a schematic, cross sectional view showing an array type semiconductor light emitting device constructed in accordance with a still further embodiment of the present invention.

FIG. 21 shows in perspective a two dimensional array type light emitting device constructed in accordance with a further embodiment of the present invention using the structure shown in any of FIGS. 10 through 20 as a unit element.

As further modifications, the side wall of the recess 120 may be inclined with respect to the surface of the substrate 111, though it has been shown to be vertical in the above-described embodiments. For example, the bottom of the recess 120 may be set smaller than its mouth, in which case the side wall of the recess 120 is inclined with respect to the surface of the substrate 111 and the angle of divergence of an emitted light beam can be made smaller, thereby allowing to enhance the directionality of emitted light beam. In addition, a fluorescent material, such as a resin including cyanine dye, may be formed on the side and/or bottom wall of the recess 120, in which case the light generated by the active region and directed toward the side and bottom walls of the recess 120 impinges on the fluorescent material, which thus contributes to increase the light output. Furthermore, the substrate 111 may be comprised of any other material than GaAs as described above. As a possible alternative semiconductor material, use may be made of GaP, InP or the like. Use has been made of AlGaAs and GaAs for forming semiconductor layers on the substrate 111 in the above-described embodiments; however, use may also be made of such materials as GaP, GaN, GaAsP, InGaP, InGaAsP, AlGaInP or the like.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A light emitting device comprising:
   a substrate having a first surface and a second surface which is opposite to said first surface, said substrate being provided with a through hole extending between said first and second surfaces;
   an active area defined in said substrate as extending in parallel with a side wall of said through hole, said active area generating light when current flows through said active area; and
   first and second electrodes formed on said substrate at opposite sides of said active area for passing current through said active area.

2. The device of claim 1 wherein said side wall is substantially perpendicular to at least one of said first and second surfaces.

3. The device of claim 2 wherein said first and second surfaces are in parallel.

4. The device of claim 1 wherein said side wall is inclined with respect to at least one of said first and second surfaces.

5. The device of claim 1 wherein said first electrode is formed on said first surface and said second surface is formed on said second surface.

6. The device of claim 1 wherein said at least one of said first and second electrode extend into said through hole on said side wall at least partly.

7. The device of claim 1 wherein said active area is formed by diffusing an impurity dopant into said substrate and said through hole is formed by a reactive ion etching method.

8. The device of claim 1 wherein said active area extends at least 10 microns along said side wall.

9. A light emitting device comprising:
a substrate having a first surface and a second surface which is opposite to said first surface, said substrate being provided with a through hole extending between said first and second surfaces and a recess at one end of said through hole, said recess being sized to receive therein one end of an optical fiber;
an active area defined in said substrate as extending in parallel with a side wall of said through hole, said active area generating light when current flows through said active area; and
first and second electrodes formed on said substrate for passing current through said active area.

10. The device of claim 9 wherein said first electrode is formed at least on said side wall and said second electrode is formed on one of said first and second surfaces.

11. An array type light emitting device, comprising:
a substrate having a first surface and a second surface which is opposite to said first surface, said substrate being provided with a plurality of through holes arranged in the form of an array, each of which extends between said first and second surfaces;
a plurality of active areas formed in said substrate, each extending in parallel with a side wall of a corresponding one of said plurality of through holes, said active areas generating light when current flows therethrough; and
first and second electrodes formed on said substrate for passing current through said active areas.

12. The device of claim 11 wherein one of said first and second electrodes is subdivided into a plurality of individual electrodes each for a corresponding one of said plurality of through holes.

13. A semiconductor light emitting device comprising:
a substrate having a surface and a first conductivity type;
a semiconductor layer formed on said surface of said substrate, said semiconductor layer including a first layer formed on said substrate and having said first conductivity type and a second layer formed on said first layer and having said first conductivity type, said semiconductor layer being formed with at least one recess having a side wall, said recess extending through said second layer, and a diffusion region of a second conductivity type, which is opposite in polarity to said first conductivity type to thereby define a pn junction extending at least along the side wall of said recess; and
first and second electrodes formed on said device for guiding current to flow across said pn junction.

14. The device of claim 13 wherein said first layer has a first forbidden band gap and said second layer has a second forbidden band gap which is smaller than said first forbidden band gap.

15. The device of claim 13 wherein said side wall is substantially perpendicular to said surface of said substrate.

16. The device of claim 13 wherein said semiconductor layer further includes a third layer formed on said second layer and having said second conductivity type, said third layer serving as a current block layer so that current flows preferentially across said pn junction extending in parallel with the side wall of said recess.

17. The device of claim 13 further comprising an electrically insulating layer formed on a selected portion of said semiconductor layer, thereby causing current to flow preferentially across said pn junction extending in parallel with the side wall of said recess.

18. The device of claim 13 wherein said substrate is provided with at least one outlet recess in alignment with said recess formed in said semiconductor layer, whereby light generated in the vicinity of said pn junction is emitted to the exterior through said outlet recess.

19. The device of claim 13 wherein said recess is filled with a predetermined material at least partly.

20. The device of claim 19 wherein said predetermined material is an electrically conductive material.

21. The device of claim 19 wherein said predetermined material is an electrically insulating material.

22. A semiconductor light emitting device comprising:
a substrate having a surface and a first conductivity type;
a semiconductor layer formed on said surface of said substrate, said semiconductor layer including a first layer formed on said substrate and having said first conductivity type and a second layer formed on said first layer and having said first conductivity type, said semiconductor layer being formed with at least one recess having a side wall, said recess extending through said second layer, and a diffusion region of a second conductivity type, which is opposite in polarity to said first conductivity type to thereby define a pn junction extending at least along the side wall of said recess; and
resonating means for causing light generated in the vicinity of said pn junction to be resonated to produce a laser light beam; and
first and second electrodes formed on said device for guiding current to flow across said pn junction.

23. The device of claim 22 wherein said resonating means includes a pair of optical reflecting elements disposed at both ends of said pn junction.

24. The device of claim 22 wherein said first layer has a first forbidden band gap and said second layer has a second forbidden band gap which is smaller than said first forbidden band gap.

* * * * *